United States Patent [19]

Schwartz et al.

[11] Patent Number: 5,518,599

[45] Date of Patent: May 21, 1996

[54] CROSS FLOW METALIZING OF COMPACT DISCS

[75] Inventors: Vladimir Schwartz, Lexington; Klaus Bierwagen, Waltham, both of Mass.

[73] Assignee: Reflekt Technology, Inc., Lexington, Mass.

[21] Appl. No.: 355,664

[22] Filed: Dec. 14, 1994

[51] Int. Cl.$^6$ .......................... C23C 14/56; C23C 16/54; B65H 1/00

[52] U.S. Cl. ................ 204/298.25; 204/298.23; 204/298.26; 204/298.27; 204/298.28; 118/719; 414/222

[58] Field of Search .................. 204/298.18, 298.23, 204/298.25, 298.26, 298.27, 298.28; 118/719, 729, 730; 414/217, 221, 222, 223, 225

[56] References Cited

U.S. PATENT DOCUMENTS

| | | | |
|---|---|---|---|
| 3,776,830 | 12/1973 | Endo | 204/298.25 |
| 4,465,416 | 8/1984 | Burkhalter et al. | 204/298.25 |
| 4,588,343 | 5/1986 | Garnett | 414/221 |
| 4,643,629 | 2/1987 | Takahashi et al. | 204/298.25 |
| 4,808,291 | 2/1989 | Denton et al. | 204/298.25 |
| 4,886,592 | 12/1989 | Anderle et al. | 204/298.25 |
| 4,969,790 | 11/1990 | Petz et al. | 118/719 |

*Primary Examiner*—R. Bruce Breneman
*Assistant Examiner*—Rodney G. McDonald
*Attorney, Agent, or Firm*—Curtis, Morris & Safford; Edgar H. Haug

[57] ABSTRACT

A cross flow system for metalizing compact discs, capable of being interposed in-line in the production of the compact discs after premastering, mastering, electro-forming, and molding includes a vacuum chamber having diametrically opposed vacuum locks and multiple metalization sources in the form of magnetrons, with a preferred cross flow including the introduction of a disc to be metalized through one lock and the exit of the metalized disc through the diametrically opposite lock. The double vacuum lock diametrically opposed cross flow system eliminates the problems of throughput limitations, high rate deposition, substrate pitting, and software complexity due to indexing which makes prior systems both costly and inefficient. The system also permits processing of more than one substrate or compact disc title such that multiple titled compact discs can be processed simultaneously.

11 Claims, 3 Drawing Sheets

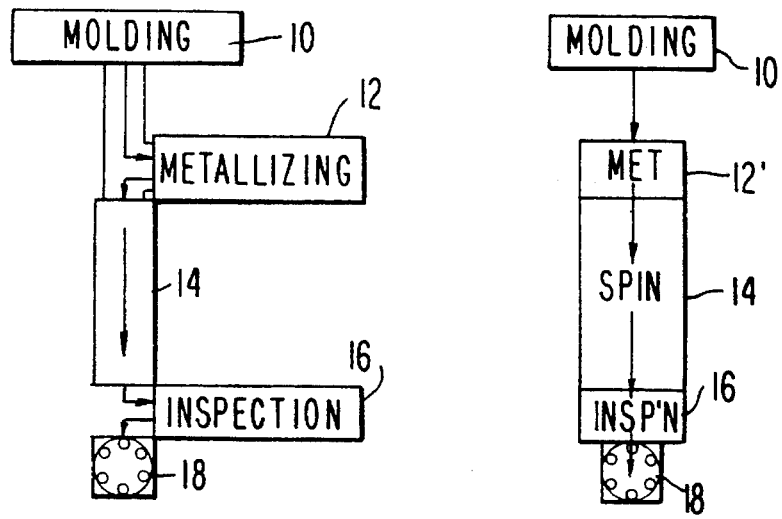
FIG. 1A
PRIOR ART
FIG. 1B
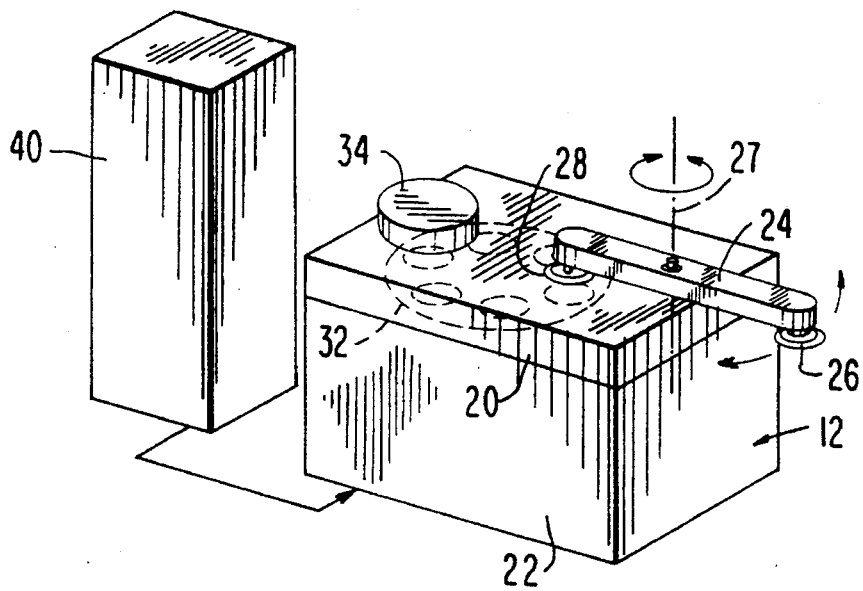
FIG. 2A
PRIOR ART
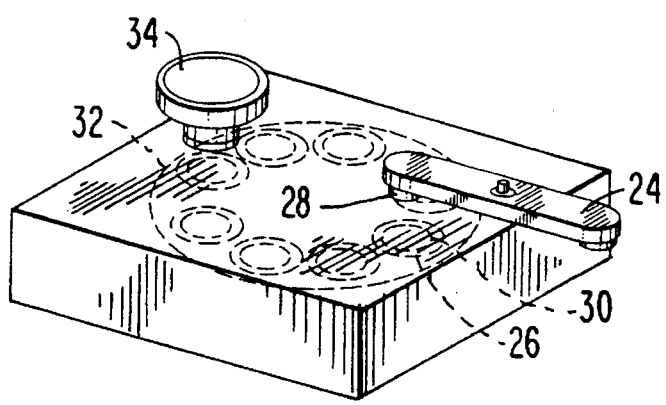
FIG. 2B
PRIOR ART 5,518,599

CROSS FLOW METALIZING OF COMPACT DISCS

FIELD OF THE INVENTION

This invention relates to the fabrication of compact discs and more particularly to a cross flow metalization system for increasing yield and decreasing complexity while permitting in-line metalization in the compact disc fabrication process.

BACKGROUND OF THE INVENTION

Compact discs or CDs are currently manufactured in a relatively complex process in which the information on the CD is first obtained for instance from a digital tape which is used to form a premastering disc that provides the information in a spiral pattern in a photo lithographic process. From the premastering disc, a master stamping disc is formed which is utilized in hot stamping a thermo plastic disc with grooves or interstices which carry the information from the premastering disc. The master stamping disc is made in an electroplating process followed by the utilization of this disc in a molding process to provide the raw plastic discs with the information encoded on one of its surfaces.

Following the molding of the discs, it is important that the discs be metalized in which the discs are provided with a thin coat of aluminum over the physical patterning on the surface of the disc. After metalization, the discs are spin coated to cover the disc with a protective coating such as lacquer. This is usually followed by an inspection step.

While prior compact discs were fabricated in a batch process in which individual discs were taken from station-to-station, present processing requires a linear flow of the discs from start to finish so that as many as 1,000 discs per hour can be manufactured.

Aside from the time consuming process of premastering, mastering, electro-plating, and molding, the metalization step has caused significant throughput and quality problems in the past. Specifically, with a single magnetron source and a single vacuum chamber having a single load lock, first the metalizer was located off-line due to its size and complexity. Most importantly however, since these units were single port devices, they could not conveniently be located in a flow line, but rather had to be located off to one side with considerable materials handling problems and complexity. Moreover, the indexing software, while simplified in the single magnetron metalization machines, requires more complication when addressing the indexing needs associated with double port, double magnetron machines used to increase the throughput.

The problems of increasing throughput while maintaining quality were also severe when attempts were made to increase the metalization speed through increasing the rate of deposition. Aside from utilizing deposition sources which were exceedingly high energy consumption devices, the increased energy in the deposition resulted in substrate pitting in which the geometry of the surface of the plastic substrate was altered, with a corresponding alteration in the quality of the information that was readable from the disc.

In terms of prior art CD vacuum metalizers, one such machine is available from Leybold in Germany and the other from Balzers located in Lictenstein. Both of the CD vacuum metalizers from these companies are essentially similar in design and throughput performance. Both metalizers have rotational transport mechanisms through the utilization of a dial inside of the vacuum chamber for the transportation of a plurality of substrates under a single deposition source which includes a magnetron. Adjoining the vacuum chambers for both metalizers are external rotational transport mechanisms for bringing the substrates in and out of the vacuum chamber through a single vacuum lock. Internal and external transport mechanisms move in a sequence to allow for loading and offloading of the substrates.

There are a number of problems associated with these CD vacuum metalizers due to the utilization of a single magnetron. In order to increase throughput, Leybold introduced a double magnetron, double vacuum lock system for the purpose of theoretically increasing the throughput twofold. However, these machines require that the disc exit the same vacuum lock it entered which results in inordinate indexing complexity. The double lock configuration of the Leybold machine also requires that the machine be off-line. This is a problem for linear direction flow, as the metalizer cannot be conveniently inserted into the production line.

Secondly, the Leybold machines have exceedingly large diameter dials exceeding five feet in some instances. The sheer size of the vacuum deposition chamber to accommodate such a large dial prevents its insertion into the production line, to say nothing of the cost of the relatively large unit. In terms of the flow of product, the Leybold double magnetron machines require a double index step in which odd numbered discs are processed by one magnetron whereas even numbered discs are processed by the second magnetron. It will be appreciated that for indexing errors of any magnitude and because each of the discs has to flow under a magnetron not assigned to its metalization, when indexing errors occur, CD titles are mixed up such that all of the mixed up discs must be discarded, as there is no way of identifying which disc was associated with which title. Thus while the double magnetron, double vacuum lock systems permit processing of multiple titles simultaneously, the indexing problems are so severe that the entire lot has to be thrown out for a small indexing error. Note that for 24 substrate holder machines, an indexing error of a few degrees throws off the entire process.

It will be appreciated that for compact disc production, orders for the compact discs are in the hundreds as opposed to thousands or tens of thousands. Thus, it is very important to be able to process different titles simultaneously to maintain the efficiency of the entire line.

Moreover, plaguing the industry is a phenomena called spindle integrity. When titles are to be processed, the discs with one title are loaded onto a single spindle, with an average of six spindles being utilized during a run. These spindles each typically hold as many as 200 CDs. If during the process indexing problems occur, then the entire lot may have to be discarded because the manufacturer must guarantee that the discs loaded on a given spindle come out with the same titles. The inability to guarantee such production is catastrophic. Customer returns for titles that are mislabeled because the content is unknown caused the industry to go from a batch manufacturing process in which mistakes were commonly made, to an in-line approach where title integrity control could be more carefully regulated. The in-line process permits only one title to be run at one time through the molding, metalizing, spin coating, and inspection process. However, the overall investment is higher due to the requirement of assigning one metalizing machine to each molding system. The higher cost in general was warranted by the higher yield since very little of the product had to be discarded, with none having to be discarded due to title integrity.

It will be appreciated that the in-line, single title processing system was not advantageous since although the title integrity was guaranteed, production runs of multiple titles were precluded.

There is therefore a necessity for providing an in-line system with efficient metalizing in which indexing problems are reduced to a minimum while at the same time being able to process multiple titles thereby to accommodate short production runs.

SUMMARY OF THE INVENTION

In the subject invention, rather than utilizing a system in which either single port, single magnetron metalizers are used or systems in which multiple magnetrons are used with each vacuum lock handling the same disc on entry and exit, in the Subject System the vacuum locks utilized for the introduction of discs are different from the ports utilized for the exiting of the discs. This permits not only a smaller machine which is capable of being interposed in a linear line, the system also eliminates indexing problems where discs must be multiplexed or interleaved during the metalization process. In one embodiment the Subject System permits the utilization of as few as four substrate carriers within a chamber, versus the utilization of as many as twelve substrate carriers within a metalization chamber. Moreover, in the Subject System in one embodiment the vacuum locks are diametrically opposed to either side of the dial. Moreover, the magnetrons utilized to metalize the discs are also located diametrically on opposite sides of the dial such that the flow of a disc from input lock to exit lock requires that the disc traveled under only one metalizing magnetron. It will however be appreciated that the magnetrons need not be diametrically opposed but rather need only be on different sides of the dial. While it is important in one embodiment to have the input and exit locks diametrically opposed to be able to most efficiently operate with a linear flow of product, in other embodiments the ports may be offset one from the other as required. It will however be noted that a non-diametric arrangement of the input and exit locks expands the overall size of the equipment so that it is non-optimal.

For a disc having one title, it enters the system from one lock, goes around the dial, becomes metalized, and exits at the other lock; whereas a second title enters the other lock and comes around with the dial in the other direction to produce the cross flow processing. After having been metalized, this second title exits the first lock. Thus the flow of product in one direction relates to one title, and the product flow in the other direction relates to the second title. This automatically guarantees title integrity as all product coming out of one lock will automatically be associated with one title. Thus title integrity can be guaranteed while at the same time having a substantially higher throughput with a better economy of machinery.

Moreover, standard deposition rate sources may be employed at either increased spacing between the magnetron and the disc or at lower electric consumption rates to prevent pitting, thereby to achieve one and a half times the production rate achievable with prior machines.

Additionally, a single magnetron metalizer can be instantly upgradable in the field simply by adding a second magnetron at a second position. This is not possible with presently utilized metalizers since they either have only a single vacuum lock, or the older single vacuum lock machines have to be remanufactured to provide a second vacuum lock.

In summary, a cross flow system for metalizing compact discs, capable of being interposed in-line in the production of the CDs after premastering, mastering, electro-forming, and molding includes diametrically opposed vacuum locks for a vacuum chamber and multiple metalization sources in the form of magnetrons, with a preferred cross flow including, the introduction of a disc to be metalized through one lock and the exit of the metalized disc through the diametrically opposite lock. The double vacuum lock diametrically opposed cross flow system eliminates the problems of throughput limitations, high rate deposition, substrate pitting, and indexing software complexity which makes prior systems both costly and inefficient. The system also permits processing of more than one substrate or CD title such that multiple titled CDs can be processed simultaneously.

BRIEF DESCRIPTION OF THE DRAWINGS

These and other features of the subject invention will be better understood in conjunction with the Detailed Description taken in conjunction with the Drawings of which:

FIG. 1A is a schematic and block diagram of a prior art line for the production of compact discs;

FIG. 1B is a schematic and diagrammatic illustration of a process for the fabrication of compact discs utilizing an in-line process with an in-line metalizer;

FIG. 2A is a diagrammatic illustration of a prior art metalization chamber utilizing a single magnetron and a single vacuum lock;

FIG. 2B is a diagrammatic illustration of the prior art single chamber, single vacuum lock metalization unit described in connection with FIG. 2A;

DETAILED DESCRIPTION

Figure 3:
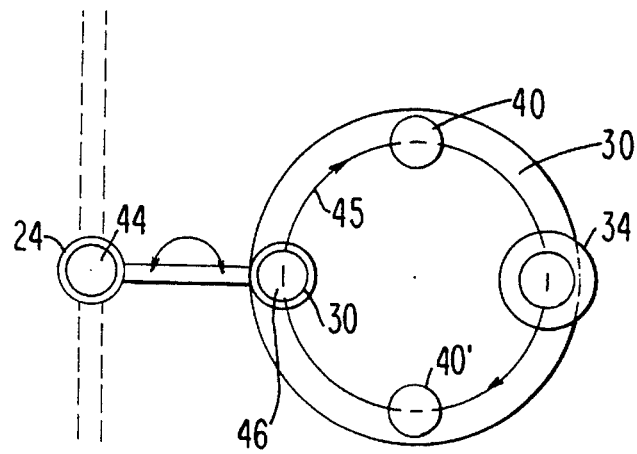
FIG. 3 is a diagrammatic top view of the prior art single port, single magnetron metalization unit.

Referring now to FIG. 1A, after a premastering step produces a master of the particular program material or content of the disc and after electroplating, the master provides a hot stamping, embossing, or stamping plate, used in the molding of an individual disc as illustrated at 10. This step is followed in the prior art with off-line metalization accomplished through a metalizer 12. After metalization of the disc, the disc is spin coated at 14 and inspected at 16 which returns the completed disc to a spindle module 18 where it is available for printing and packaging.

It will be appreciated that in the flow process illustrated in FIG. 1A, the metalizer is located off-line due to its single port configuration. By off-line is meant that the metalizer is not serviced by the main conveyor utilized to transport the molded disc through the system.

In contradistinction as shown in FIG. 1B, a metalizer 12' is located in-line with the flow of product from the molding station through the metalization station and the spin coating station and through the inspection station to the spindle module.

Aside from the interruption of the flow path for off-line metalizing, the aforementioned problems of throughput prevent efficient use of such single port, single magnetron machinery.

Referring to FIG. 2A such a prior art metalizer 12 includes a chamber 20 above a pump and drive housing 22 in which a load lock manipulator 24 carries discs 26 to be metalized via suction in which manipulator 24 is revolved about an axis 27 to locate a disc above an aperture 28 at the entrance to the single vacuum lock of the chamber. Once the disc is in the chamber, it is located in a substrate holder 30 within a dial 32 which rotates the disc underneath a metalizing unit in the form of a magnetron 34, all under the control of a computer within a controls cabinet 40. The operation of this prior art metalizer can be more readily seen in connection with FIG. 2B in which disc 26 is located within substrate holder 30 located within dial 32, with like reference characters referring to like elements between these two figures.

As mentioned hereinbefore, the single vacuum lock, single magnetron system, while preventing problems with title integrity is slow and cumbersome insofar as the throughput through such a machine is limited due to the utilization of a single magnetron sputtering step.

Referring to FIG. 3, such single magnetron, single vacuum lock machines are connected to an external transport 42 from which a load lock manipulator 24 loads a disc 44 through vacuum lock 46 into the corresponding substrate holder 30. Disc 44 revolves around in the direction of arrow 45 via movement of rotary dial 30 until it is positioned underneath magnetron 34, at which time the metalization is sputtered to the surface of the disc. The disc then moves as illustrated at 40' towards vacuum lock 46 which is positioned beneath aperture 28 in FIG. 2A.

Figure 4:
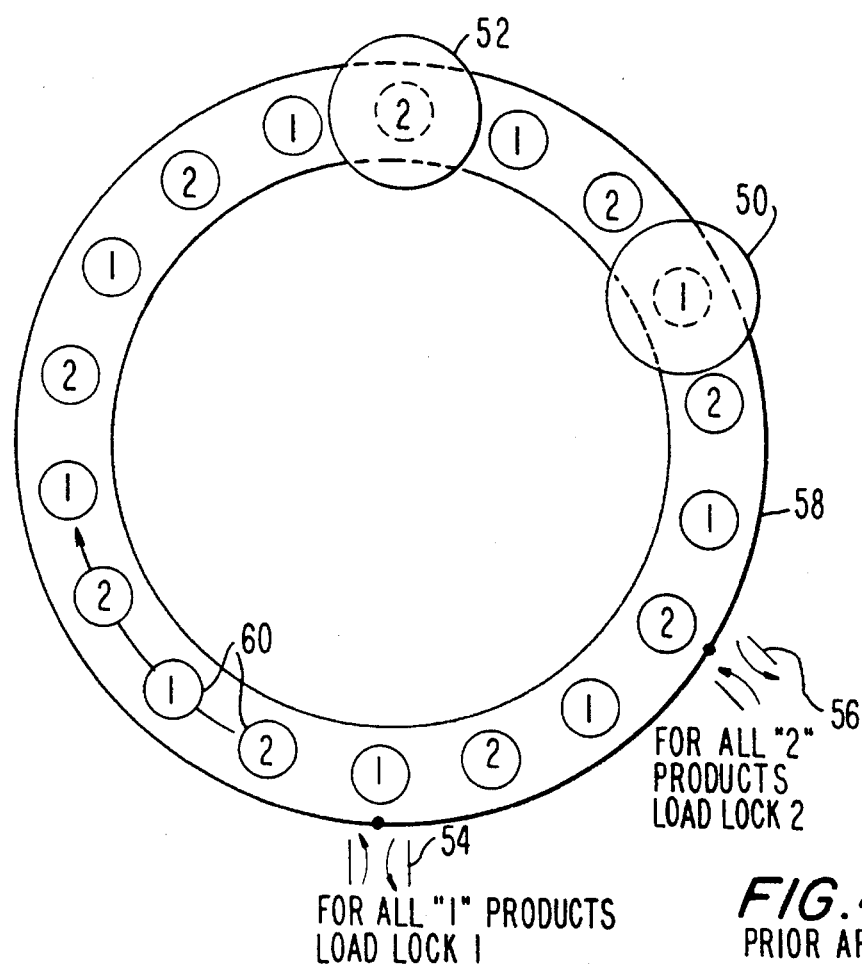
FIG. 4 is a diagrammatic and top view of a prior art multi-port, multi-magnetron system in which compact discs enter and exit the same vacuum lock.

Referring now to FIG. 4 in an effort to increase the throughput of such single port, single magnetron machines, a metalization unit is provided with two magnetrons, here illustrated at 50 and 52, with two vacuum locks being provided as illustrated at 54 and 56. The rotary dial 58 in these machines is upwards of 5 feet in diameter and has 24 substrate holders 60 which are divided as illustrated into odd and even numbered substrate holders.

In operation, products having a single title, here labeled "1" are loaded in at vacuum lock 54 where they were placed in the appropriate substrate holder. Likewise for a second title here labeled title "2", these titles are loaded in through vacuum lock 56 into a substrate holder designated with an even number. The indexing system positions the discs having the respective titles under the associated magnetron so that the magnetrons associated with one title metalizes only that title. The result is that products with one title enter and exit a given vacuum lock. Problems associated with such a system outlined above, include a lack of title integrity when the indexing system fails, resulting in the discarding of all of the discs in the run.

Figure 5:
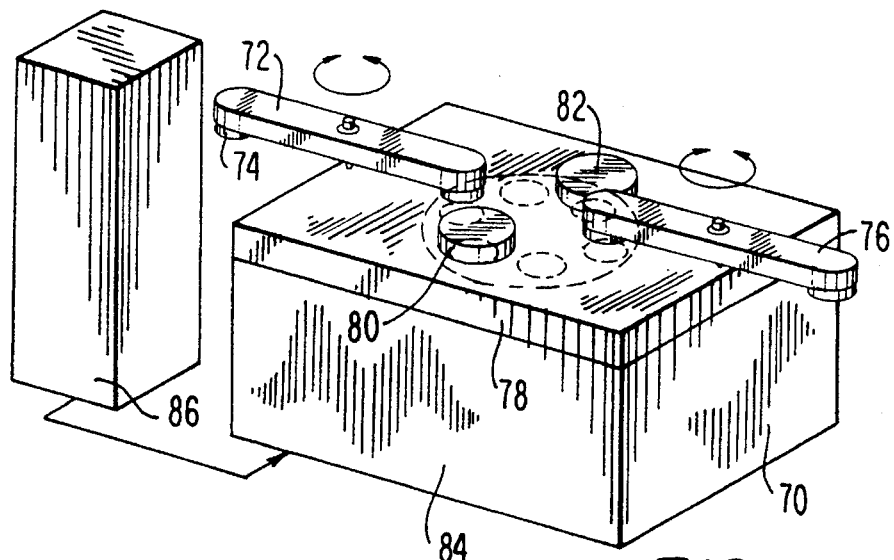
FIG. 5 is a diagrammatic representation of the Subject metalizing system utilizing diametrically opposed vacuum locks used for loading and unloading discs and double magnetron metalization stations within a vacuum chamber to implement cross flow processing.

Referring now to FIG. 5 unlike the prior art systems, a metalization unit 70 is interposed in the line in which a load lock manipulator 72 receives incoming discs 74 and which processes these discs by metalizing them such that they exit at an exit manipulator 76 after having passed through a vacuum chamber 78 which includes two magnetrons 80 and 82. With respect to the metalization of all discs coming in through manipulator 72, these discs pass under only one of the magnetrons such that there is a guarantee that all discs moving in one direction have the same title and have a quality guaranteed by the magnetron. It will of course be appreciated that the pumps and drive 84 of unit 70 as well as the indexing of the dial and manipulation is under the control of a computer housed in a controls cabinet 86.

Figure 6:
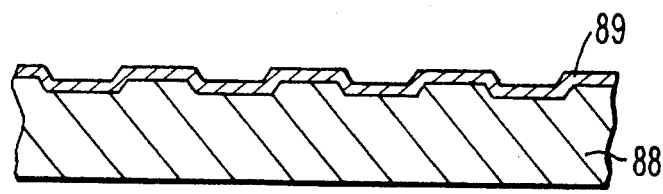
FIG. 6 is a cross sectional view of a portion of a compact disc which has been metalized in accordance with the Subject Invention; and, FIG. 7 is a top schematic view of the Subject metalization unit illustrating diametrically opposed input and exit vacuum locks and multiple magnetrons, also illustrating a cross flow system for product flow through the vacuum chamber.

Referring now to FIG. 6, it will be appreciated that the stamped disc 88 is provided with a reflective coating 89 during the metallizing process.

Figure 7:
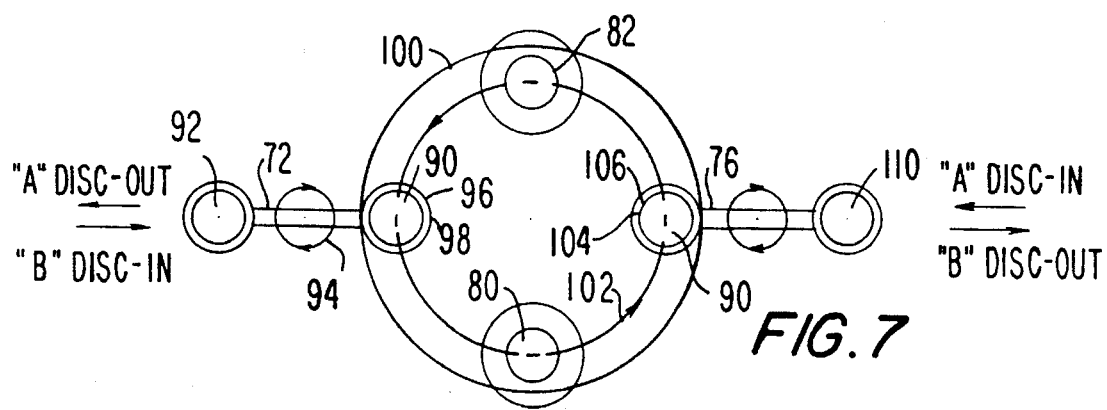

Referring now to FIG. 7, it will be appreciated that there is a vacuum lock 90 associated with manipulator 72 which processes discs 92 vacuum captured by manipulator 72 such that they are moved as illustrated by arrows 94 to an entrance aperture 96 above a substrate handler 98 located on dial 100. When dial 100 is rotated in the direction of arrow 102, the disc 92 passes under magnetron 80 where metalization takes place. Thereafter the disc is transported to an aperture 104 above a vacuum lock 106 diametrically opposed to vacuum lock 98, from whence the metalized disc 92 is extracted via transport 76 and passed down the line.

Likewise a disc of a different title may be loaded as illustrated by disc 110 which passes under magnetron 82 and exits vacuum lock 90 so that a cross flow exists as indicated by the passage of different titles in different directions through the system.

By so doing not only is title integrity guaranteed, linear flow of product through the line is achieved to minimize both space and complexity of the indexing system.

What has been achieved is a materials handling system which significantly improves the quality and speed with which compact discs or other articles can be manipulated through a vacuum chamber in a cross flow process in which, in a preferred embodiment, entrance and exit locks are diametrically opposed. The system is not only capable of handling compact discs which must be metalized but is also useful in semi conductor processing in which substrates including plastic, ceramic, metal or semiconductor wafers are to be metalized via vacuum deposition or otherwise processed due to the cross flow configuration which establishes product separation while at the same time increasing throughput.

Having above indicated a preferred embodiment of the present invention, it will occur to those skilled in the art that modifications and alternatives can be practiced within the spirit of the invention. It is accordingly intended to define the scope of the invention only as indicated in the following claims.

We claim:

1. Apparatus for the metalization of compact discs to permit in-line processing during the fabrication of said discs in which metalization is proceeded by molding and succeeded by coating of said disc, comprising:

a vacuum chamber having first and second diametrically opposed vacuum locks adapted to introduce discs to be metalized therethrough and into said chamber and to permit removal of metalized discs therethrough such that said metalized discs exit said chamber;

means for evacuating said chamber;

a disc shaped dial having a plurality of substrate holders located about the periphery thereof;

means for mounting said dial in said chamber such that said dial rotates within said chamber with said substrate holders passing adjacent said vacuum locks;

means for positioning said discs in said substrate holders;

at least two sputtering means within said chamber, with said sputtering means located to different sides of a line between said diametrically opposed vacuum locks;

means for indexing said dial such that said substrate holders dwell beneath said sputtering means for a length of time; and means for activating said sputtering means in timed relationship to the passage of said discs therebeneath, wherein the paths of said discs through said chamber establish a counterflow in which discs pass through said chamber in opposite directions with each vacuum lock serving as both an entrance and exit port, such that discs entering said chamber through said first vacuum lock exit said chamber through said second vacuum lock and discs entering said chamber through said second vacuum lock exit said chamber through said first vacuum lock, whereby the throughput of said chamber is increased over a single port chamber without disturbing the linear flow of said line.

2. The apparatus of claim 1, wherein each of said sputtering means includes a magnetron.

3. The apparatus of claim 1, wherein said means for positioning said discs includes a disc manipulator external to said chamber, said vacuum locks each including an aperture communicating with said manipulator for the introduction of discs therethrough.

4. The apparatus of claim 1 and further including spindle modules associated one each with different vacuum locks for receiving only discs passing through said chamber in only one direction, whereby discs of a given title are separated by the direction they pass through said chamber and the vacuum lock they exit from, each vacuum lock thereby establishing the title of the disc exiting therefrom.

5. Apparatus for the metalization of a plurality of substrates to permit in-line processing during the fabrication thereof, comprising:

a vacuum chamber having at least a pair of vacuum locks adapted to introduce substrates to be metalized therethrough and into said chamber and to permit removal of metalized substrates therethrough such that said metalized substrates exit said chamber;

at least two sputtering means within said chamber, with said sputtering means located to different sides of a line between said pair of vacuum locks; and, means for transporting said substrates to, from and within said chamber in different directions through said chamber such that different sets of substrates pass in different directions through said chamber in a counterflow fashion, with different sets of substrates passing adjacent different ones of said sputtering means from one vacuum lock to another such that said substrates move in a counterflow fashion from one vacuum lock to another with no substrate exiting a vacuum lock it entered.

6. The apparatus of claim 5, wherein said substrates are compact discs.

7. The apparatus of claim 5, wherein said substrates are semiconductor wafers.

8. The apparatus of claim 5, wherein said substrates are plastic.

9. The apparatus of claim 5, wherein said substrates are ceramic.

10. The apparatus of claim 5, wherein said substrates are metal.

11. Apparatus for the metalization of compact discs to permit in-line processing during the fabrication of said discs in which metalization is proceeded by molding and succeeded by coating of said disc, comprising:

a vacuum chamber having first and second diametrically opposed vacuum locks adapted to introduce discs to be metalized therethrough and into said chamber and to permit removal of metalized discs therethrough such that said metalized discs exit said chamber;

means for evacuating said chamber;

a disc shaped dial having a plurality of substrate holders located about the periphery thereof;

means for mounting said dial in said chamber such that said dial rotates within said chamber with said substrate holders passing adjacent said vacuum locks;

means for positioning said discs in said substrate holders;

at least two sputtering means within said chamber, with said sputtering means located to different sides of a line between said diametrically opposed vacuum locks;

means for indexing said dial such that said substrate holders dwell beneath said sputtering means for a length of time; and means for activating said sputtering means in timed relationship to the passage of said discs therebeneath, wherein said indexing means causes the rotation of said dial an amount equal to the angle of distribution of the discs positioned in said substrate holders between each actuation of said sputtering means, and wherein the paths of said discs through said chamber establish a counterflow in which discs pass through said chamber in opposite directions with each vacuum lock serving as both an entrance and exit port, such that discs entering said chamber through said first vacuum lock exit said chamber through said second vacuum lock and discs entering said chamber through said second vacuum lock exit said chamber through said first vacuum lock, whereby the throughput of said chamber is increased over a single port chamber without disturbing the linear flow of said line.

* * * * *